(12) United States Patent
Sugiura et al.

(10) Patent No.: US 7,598,118 B2
(45) Date of Patent: Oct. 6, 2009

(54) METHOD OF MANUFACTURING SEMICONDUCTOR SENSOR

(75) Inventors: Kazuhiko Sugiura, Nagoya (JP); Kenichi Yokoyama, Nagoya (JP); Muneo Tamura, Nagoya (JP)

(73) Assignee: Denso Corporation, Kariya (JP)

( * ) Notice: Subject to any disclaimer, the term of this patent is extended or adjusted under 35 U.S.C. 154(b) by 269 days.

(21) Appl. No.: 11/585,114

(22) Filed: Oct. 24, 2006

(65) Prior Publication Data

US 2007/0117260 A1    May 24, 2007

(30) Foreign Application Priority Data

Nov. 18, 2005    (JP)    ............... 2005-333606

(51) Int. Cl.
*H01L 21/00* (2006.01)
(52) U.S. Cl. ............... 438/106; 438/456; 257/E21.499
(58) Field of Classification Search ......... 438/106–127, 438/455–465; 257/678–733, E21.499
See application file for complete search history.

(56) References Cited

U.S. PATENT DOCUMENTS

| | | | | |
|---|---|---|---|---|
| 5,668,033 | A * | 9/1997 | Ohara et al. ................. | 438/113 |
| 6,310,421 | B2 * | 10/2001 | Morishima .............. | 310/313 R |
| 6,716,666 | B2 | 4/2004 | Silverbrook | |
| 6,806,557 | B2 * | 10/2004 | Ding ......................... | 257/659 |
| 6,812,062 | B2 | 11/2004 | Silverbrook | |
| 6,977,189 | B2 | 12/2005 | Silverbrook | |
| 6,979,599 | B2 | 12/2005 | Silverbrook | |
| 6,982,189 | B2 | 1/2006 | Silverbrook | |
| 6,989,292 | B2 | 1/2006 | Silverbrook | |
| 7,008,819 | B2 | 3/2006 | Silverbrook | |
| 7,026,176 | B2 | 4/2006 | Silverbrook | |
| 7,126,216 | B2 | 10/2006 | Silverbrook | |
| 7,173,332 | B2 | 2/2007 | Silverbrook | |
| 7,303,976 | B2 * | 12/2007 | Sand ........................... | 438/455 |
| 2002/0088537 | A1 | 7/2002 | Silverbrook | |
| 2004/0025589 | A1 | 2/2004 | Kurle et al. | |
| 2007/0020807 | A1 * | 1/2007 | Geefay et al. ................ | 438/106 |

FOREIGN PATENT DOCUMENTS

| | | |
|---|---|---|
| DE | 103 15 068 | 8/2004 |
| DE | 102004004476 | 7/2005 |
| JP | A-2004-101528 | 4/2004 |

OTHER PUBLICATIONS

Office Action issued on Jun. 12, 2008 in the corresponding German patent application 10 2006 052 693.7 (and English Translation).

* cited by examiner

*Primary Examiner*—Khiem D Nguyen
(74) *Attorney, Agent, or Firm*—Posz Law Group, PLC

(57) ABSTRACT

A method of manufacturing a semiconductor sensor includes a forming step, a preparing step, a fixing step and a separating step. In the forming step, a plurality of caps made of resin is formed on a supporting substrate through a separable agent. Each of the caps has a cavity therein. In the preparing step, a semiconductor wafer is prepared, on which a plurality of sensor elements are formed. In the fixing step, the caps are fixed to the semiconductor wafer. Each cavity of the caps corresponds to each of the sensor elements. In the separating step, the separable agent and the supporting substrate are separated from the caps so as to leave the caps on the semiconductor wafer.

8 Claims, 3 Drawing Sheets

METHOD OF MANUFACTURING SEMICONDUCTOR SENSOR

CROSS REFERENCE TO RELATED APPLICATION

This application is based on Japanese Patent Application No. 2005-333606 filed on Nov. 18, 2005, the disclosure of which is incorporated herein by reference in its entirety.

BACKGROUND OF THE INVENTION

1. Field of the Invention

The present invention relates to a method of manufacturing a semiconductor sensor. For example, the sensor is used for detecting a physical amount such as an acceleration, a yaw rate or an oscillation.

2. Description of Related Art

A movable portion is disposed in a semiconductor sensor for detecting a physical (dynamic) amount, e.g., acceleration sensor or gyro sensor. However, durability performance of the movable portion is low due to its structure. Then, in order to reduce generation of defects, e.g., breakage, in a process for manufacturing the sensors, a cap is attached to a surface of a sensor chip including the movable portion.

For example, a cap is formed by layering a glass substrate or silicon on a sensor chip, according to US 2004/0025589 A1 (corresponding to JP-T2-2004-506203). The cap is formed over an entire wafer without being divided, on which plural sensors will be formed. However, an electrode pad has to be made in an exposed state in order to be connected to a sensor circuit. Therefore, a complicated treatment such as an etching or a grinding has to be performed. Further, a cost for manufacturing sensors may be increased, because the glass substrate or the silicon is used.

By contrast, in JP-A-2004-101528, a temporary cap made of resin is used in a variety of processes for manufacturing a sensor, and the temporary cap is removed after the processes are completed. However, the temporary cap cannot be used as a permanent cap, because durability performance of the temporary cap is low.

SUMMARY OF THE INVENTION

In view of the foregoing and other problems, it is an object of the present invention to provide a method of manufacturing a semiconductor sensor. According to the method, plural divided caps are formed on a wafer, from which plural sensor chips are formed. Further, the caps can be permanently used in the manufactured sensor.

According to an example of the present invention, a method of manufacturing a semiconductor sensor includes a forming step, a preparing step, a fixing step and a separating step. In the forming step, a plurality of caps made of resin is formed on a supporting substrate through a separable agent. Each of the caps has a cavity therein. In the preparing step, a semiconductor wafer is prepared, on which a plurality of sensor elements are formed. In the fixing step, the caps are fixed to the semiconductor wafer such that each cavity of the caps corresponds to each of the sensor elements. In the separating step, the separable agent and the supporting substrate are separated from the caps so as to leave the caps on the semiconductor wafer.

Accordingly, the caps are formed to be divided from each other on the wafer without a dicing, and the caps can be permanently used for the semiconductor sensor.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF PREFERRED EMBODIMENTS

First Embodiment

A semiconductor sensor for detecting a physical quantity (dynamic amount), e.g., acceleration sensor or gyro sensor, including a movable portion is manufactured, as shown in FIGS. 1A-1F, in a first embodiment. In the manufacturing process, a cap 3 for covering a sensor element 4a is formed, and the cap 3 is fixed to a semiconductor wafer 4. The forming of the cap 3 and the fixing of the cap 3 are performed after the sensor element 4a is formed on the semiconductor wafer 4 by a common semiconductor process. Then, a dicing process is performed after the cap 3 is fixed to the wafer 4. In the first embodiment, the manufacturing process will be described from the forming of the cap 3.

Figure 1A:
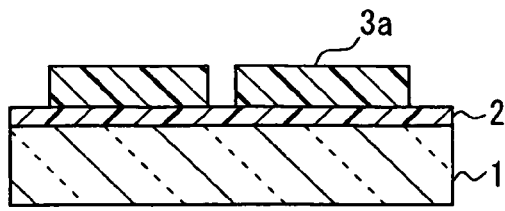
FIGS. 1A-1F are cross-sectional views showing processes for manufacturing a semiconductor sensor according to a first embodiment of the present invention.

First, a process for forming the cap 3 is performed. Specifically, as shown in FIG. 1A, a supporting substrate 1 made of glass is prepared, and a thermal separable agent 2 (thermal separation layer) is coated on the substrate 1. The thermal separable agent 2 can be easily separated, when an adhesive force of the thermal separable agent 2 is lowered at a specified temperature. The specified temperature is determined based on a material of the agent 2, and the specified temperature is 150° C. or 170° C., for example. Thermoplastic polyimide or polyamide-imide is used for forming the thermal separable agent 2. A commercial product, e.g., thermal release tape REVALPHA manufactured by NITTO DENKO Corp., is also used for forming the thermal separable agent 2.

Figure 2:
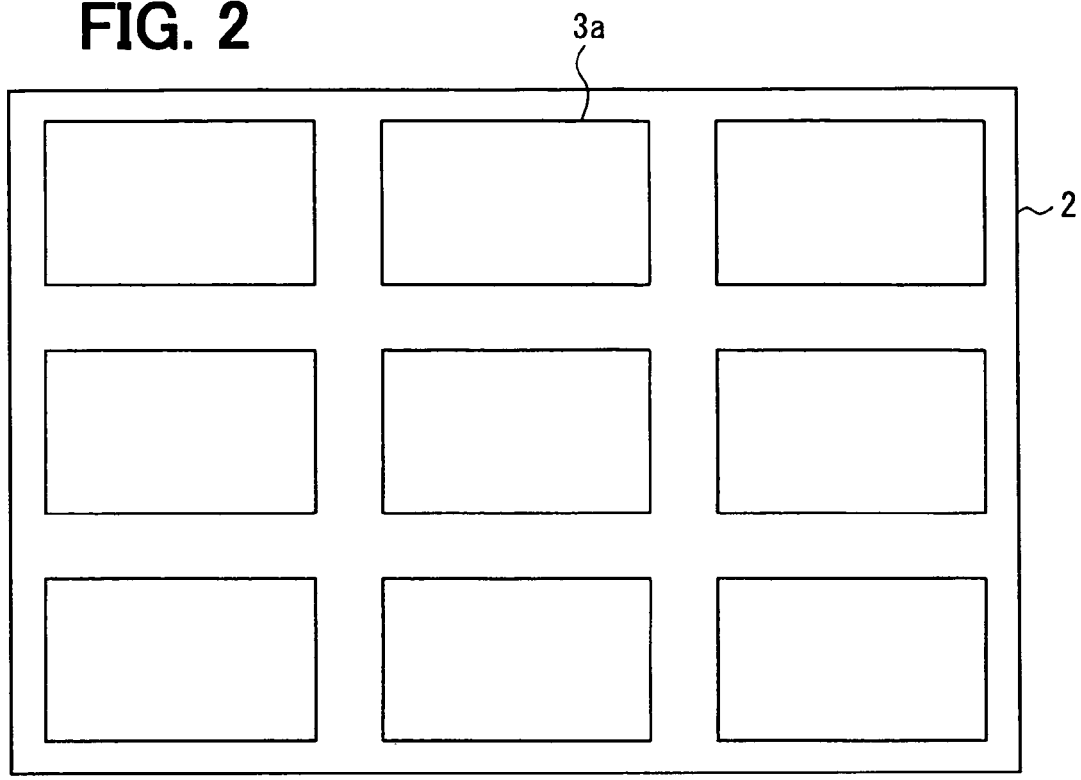
FIG. 2 is a plan view of FIG. 1A.

Then, plural cap portions (covers) 3a for covering the sensor elements 4a are formed on the thermal separable agent 2 by a printing method such as a screen-printing or an inkjet printing, for example. The cap portions 3a are made of resin, and have a pattern shown in FIG. 2. Each of the cap portions 3a corresponds to the sensor element 4a on the semiconductor wafer 4, and the cap portions 3a are separated from each other. Each mask of the cap portions 3a is formed into a rectangular shape, as shown in FIG. 2.

Figure 1B:
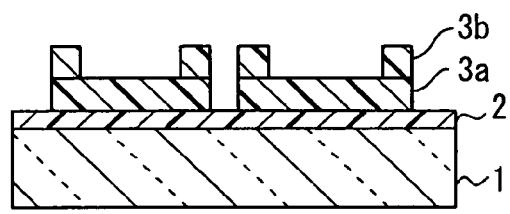
Figure 3:
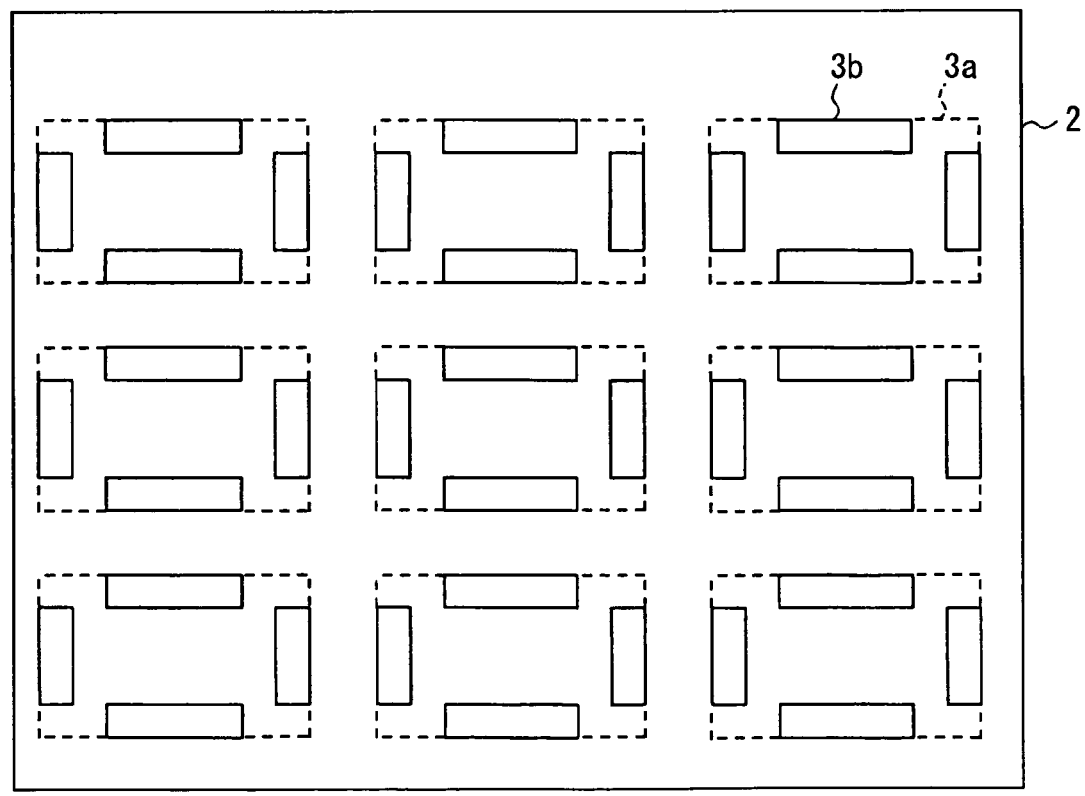
FIG. 3 is a plan view of FIG. 1B.

Next, as shown in FIG. 1B, supporting portions 3b made of resin are formed at four corners or on four sides of the mask of the cap portion 3a. In this embodiment, the supporting portions 3b are formed on the four sides. The supporting portion 3b is used as a spacer for making a space between the cap portion 3a and the wafer 4, and formed by a method similar to the above-described method for forming the masks of the cap portions 3a. As shown in FIG. 3, the supporting portions 3b are formed on four sides of the mask of the cap portion 3a. The supporting portions 3b are not formed on parts corresponding to the sensor elements 4a, and the parts are left to form cavities.

Figure 1C:
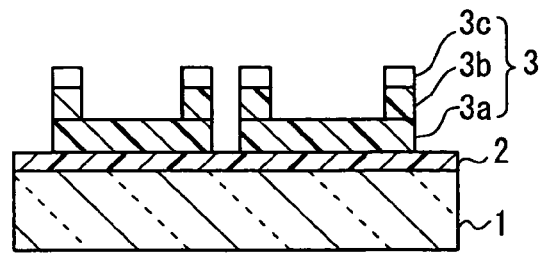

Next, as shown in FIG. 1C, an adhesive 3c is dispensed on the supporting portion 3b, that is, the adhesive 3c is coated on the supporting portion 3b. The adhesive 3c is optionally coated based on a material of the thermal separable agent 2. For example, when thermoplastic polyimide is used for forming the thermal separable agent 2, the coating for the adhesive 3c is not required. The supporting portions 3b are directly fixed to the wafer 4 with a temperature of about 250° C. Silicon adhesive or organic adhesive such as epoxy adhesive may be used as the adhesive 3c, for example.

Thus, the cap 3 made of resin is completely constructed by the cap portion 3a and the supporting portion 3b. Alternatively, the cap 3 is completely constructed by the cap portion 3a, the supporting portion 3b and the adhesive 3c. The cap 3 has a cavity, i.e., concave, in which the supporting portion 3b is not positioned. Next, the cap 3 will be fixed to the semiconductor wafer 4.

Figure 1D:
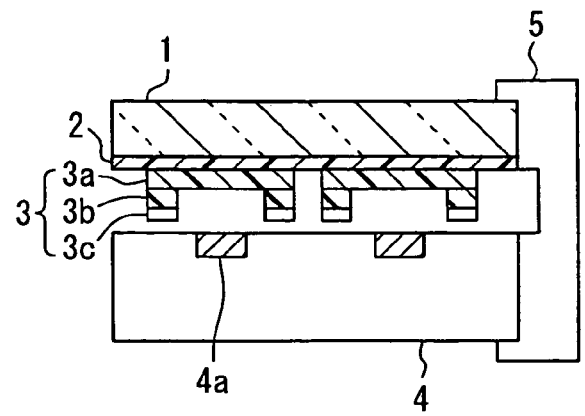

Specifically, as shown in FIG. 1D, the supporting substrate 1 having the caps 3 is positioned above the semiconductor wafer 4 including the sensor elements 4a. At this time, a face of the supporting substrate 1, on which the caps 3 are formed, and a face of the semiconductor wafer 4, on which the sensor elements 4a are formed, face each other. Then, an alignment device 5 determines an alignment between the supporting substrate 1 and the semiconductor wafer 4, such that each of the sensor elements 4a and each of the cap portions 3a are positioned to face each other by using alignment marks of the supporting substrate 1 and the semiconductor wafer 4.

Figure 1E:
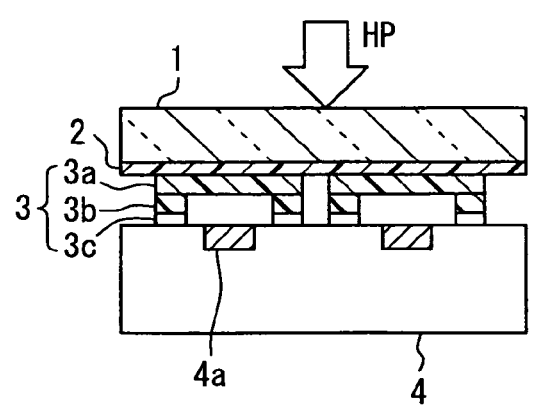

Next, as shown in FIG. 1E, heat and pressure HP are applied on the supporting substrate 1 in the arrow direction by a wafer-integrating device. Thereby, the cap 3 is fixed to the wafer 4 through the supporting portion 3b. The cap 3 covers the sensor element 4a such that the cap portion 3a and the sensor element 4a are not in contact with each other, because the cap 3 has the cavity formed by the supporting portions 3b as described above. At the same time, an adhesion force between the cap 3 and the thermal separable agent 2 is lowered, because the thermal separable agent 2 is heated so as to have a predetermined or more temperature.

Figure 1F:
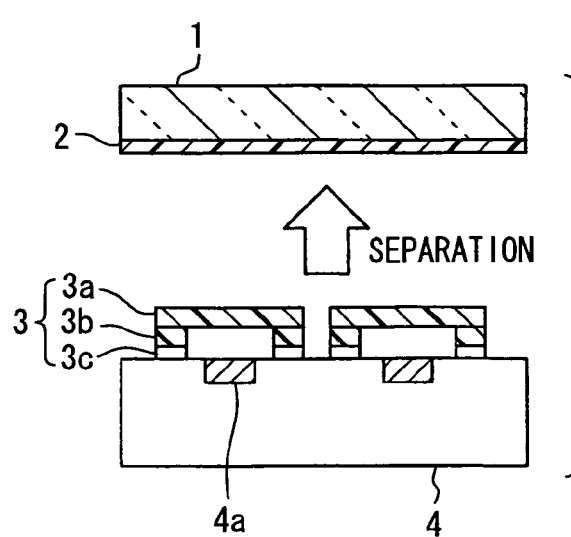

Therefore, as shown in FIG. 1F, the supporting substrate 1 and the thermal separable agent 2 are separated from the cap 3 in the arrow direction of FIG. 1F. The supporting substrate 1 and the thermal separable agent 2 may be separated together from the cap 3. However, in this case, much power is required compared with a case in which the thermal separable agent 2 is simply separated. Alternatively, after the supporting substrate 1 is separated from the thermal separable agent 2, the thermal separable agent 2 may be separated from the cap 3. In order to perform the respective separations in this order, materials for forming the thermal separable agent 2 and the supporting substrate 1 are determined such that an adhesion force at an interface between the thermal separable agent 2 and the supporting substrate 1 is lowered by heating. Thus, the supporting substrate 1 is easily separated from the thermal separable agent 2.

Thus, a cap formed structure, in which the cap 3 covers the sensor element 4a, is completed. Thereafter, processes may be performed to the cap formed structure, if required. Then, each of the sensor elements 4a is a chip unit divided by dicing. Thereby, a covered structure, in which each of the caps 3 covers the chip unit including the sensor element 4a, is completed. At this time, a process for dividing the caps 3 after covering is not required, because each of the caps 3 is already formed to cover the corresponding sensor element 4a.

According to the first embodiment, the caps 3 can be formed without a dividing process, and the number of the caps 3 corresponds to the number of the sensor elements 4a. Therefore, a complicated process such as an etching or a grinding is not required in order to make an exposed electrode pad for being connected to a sensor circuit. Further, a cost for manufacturing the semiconductor physical quantity sensor can be reduced, because the caps 3 can be made of inexpensive resin.

Furthermore, the caps 3 are easily separated from the thermal separable agent 2 by heating, after the caps 3 are fixed to the semiconductor wafer 4. Therefore, when a dicing process is performed, it is unnecessary to divide the caps 3 for the corresponding sensor elements 4a. Afterward, the cap 3 can be used for a completed semiconductor sensor. Moreover, the cap 3 has a high durability performance, because the cap 3 is made of resin. Therefore, the cap 3 can be permanently used.

Second Embodiment

Figure 4A:
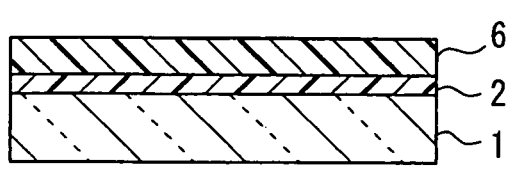
FIGS. 4A-4G are cross-sectional views showing processes for manufacturing a semiconductor physical quantity sensor according to a second embodiment of the present invention.

Caps 3 are formed by etching in a second embodiment, and the other parts may be made similar to the first embodiment. As shown in FIG. 4A, a thermal separable agent 2 is coated on a supporting substrate 1, and a cap layer 6 made of resin is formed on the thermal separable agent 2. The caps 3 are formed by etching the layer 6. For example, the cap layer 6 is made of thermosetting polyimide. A thickness of the layer 6 is the same as a thickness combining the cap portion 3a and the supporting portion 3b described in the first embodiment.

Figure 4E:
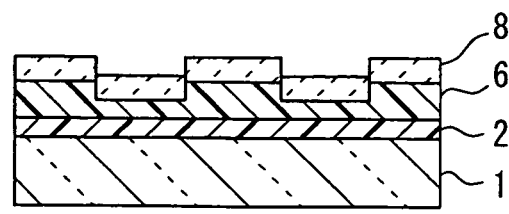
Figure 4B:
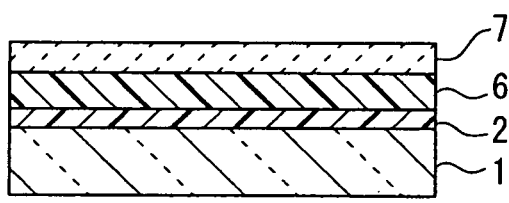
Figure 4F:
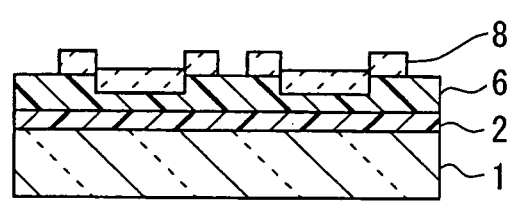
Figure 4C:
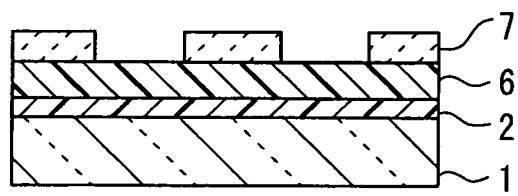

Then, as shown in FIG. 4B, a resist (first mask) 7 is formed on the layer 6, and a first aperture is formed in the resist 7 by an exposing treatment and a processing treatment, as shown in FIG. 4C. A position of the first aperture corresponds to a position to be a cavity of the cap 3.

Figure 4G:
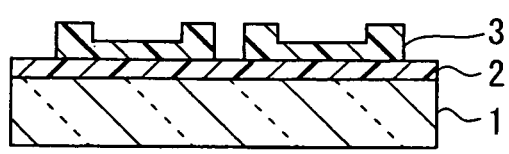
Figure 4D:
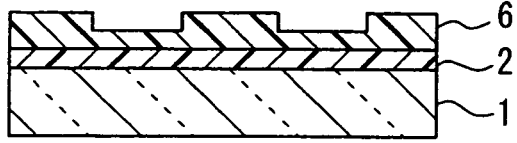

Next, as shown in FIG. 4D, the cavity is formed in the layer 6 by a wet etching, for example. The resist 7 is used as a mask, and the wet etching is performed such that the cavity has a depth in a thickness direction of the layer 6. At this time, an etching selection ratio can be enhanced, because the layer 6 is made of the thermosetting polyimide. Accordingly, the etching can be accurately performed.

Then, after the resist 7 is removed by washing, another resist (second mask) 8 is formed on the layer 6, as shown in FIG. 4E. Next, as shown in FIG. 4F, a second aperture is formed in the resist 8 by an exposing treatment and a processing treatment. A position of the second aperture corresponds to a position except for the cavity of the cap 3, that is, the position of the second aperture corresponds to a position for dividing the caps 3. Thereafter, as shown in FIG. 4G, a part of the layer 6 corresponding to the second aperture is removed by a wet etching, for example. The resist 8 is used as a mask, when the wet etching is performed. Then, the resist 8 is removed.

Thus, the layer 6 is divided into the plural caps 3, and the caps 3 have the cavities. Thereafter, the above-described processes shown in FIGS. 1C-1F are performed to the caps 3. Thereby, a structure similar to that formed in the first embodiment can be formed, in which each cap 3 covers each sensor element 4a. In addition, when the cap layer 6 is made of the thermosetting polyimide, an adhesive 3c is coated on the cap 3 as shown in FIG. 1C, because an adhesion force is required.

According to the second embodiment, the cap 3 can be permanently used, because the cap 3 is made of resin having a high durability performance. Further, the same advantage can be obtained in the second embodiment as the first embodiment, because the caps 3 can be divided before the caps 3 are fixed to the semiconductor wafer 4, although the process for dividing the caps 3 from the cap layer 6 is further required in the second embodiment.

Other Embodiments

The thermal separable agent 2 is heated through the supporting substrate 1 in the above embodiments. Alternatively, the semiconductor wafer 4 and the supporting substrate 1 may be totally heated in a heating chamber.

The thermal separable agent 2 is used in the first embodiment. Alternatively, an adhesive film having a small adhesion force may be used. Further, an UV hardened film may be used instead of the agent 2. An adhesion force of the UV hardened film is lowered by radiating ultraviolet rays. A film, which is easily separated by a solvent, a chemical, a vapor of the solvent or the chemical or a water vapor, may be used. For example, when an organic adhesive is used as the adhesive 3c, an organic solvent, e.g., isopropyl alcohol (IPA), acetone or xylene, can be used as the solvent. In this case, the supporting substrate 1 can be easily separated from the caps 3 by immersing the organic adhesive in the organic solvent.

Such changes and modifications are to be understood as being within the scope of the present invention as defined by the appended claims.

What is claimed is:

1. A method of manufacturing a semiconductor sensor, the method comprising:
    forming a plurality of cap portions by using a resin on a single separable agent formed on a supporting substrate, the cap portions being formed on the single separable agent to be separated from each other;
    forming a cavity in each of the cap portions, wherein:
    the forming of a cavity in each of the cap portions includes
        forming a cap layer on the single separable agent;
        forming a first mask on the cap layer to have apertures at positions corresponding to the cavity in each of the cap portions;
        etching the cap layer using the first mask, so as to form the cavity in each of the cap portions;
        removing the first mask;
        forming a second mask to have apertures at positions corresponding to dividing positions of the cap portions on the cap layer after the removing of the first mask;
        dividing the cap layer into the cap portions by etching using the second mask; and
        removing the second mask;
    preparing a semiconductor wafer, on which a plurality of sensor elements are formed;
    fixing the cap portions, which have been formed on the supporting substrate via the single separable agent, to the semiconductor wafer such that the cavity in each of the cap portions corresponds to each of the sensor elements; and
    separating the single separable agent together with the supporting substrate from the cap portions so as to leave the cap portions on the semiconductor wafer.

2. The method according to claim 1, further comprising:
    coating an adhesive on a face of the cap portions to be fixed to the semiconductor wafer, and the cap layer is made of thermosetting polyimide.

3. The method according to claim 1, wherein:
    the single separable agent has an adhesion force, which is lowered when the single separable agent is heated to have a predetermined temperature; and
    the separating is performed by heating the single separable agent.

4. The method according to claim 1, wherein:
    the fixing is performed by applying pressure to the supporting substrate and the semiconductor wafer, while being heated; and
    the separating is performed by the heat used during the fixing.

5. A method of manufacturing a semiconductor sensor, the method comprising:
    coating a supporting substrate with a thermal separable agent, the thermal separable agent comprising an adhesive force that is lowered at a predetermined temperature;
    forming a plurality of separate cap portions on the thermal separable agent and
    forming a cavity in each one of the cap portion by
        forming a cap layer on the thermal separable agent,
        forming a first mask to have apertures at positions corresponding to the cavities, on the cap layer,
        etching the cap layer using the first mask, so as to form the cavities,
        forming a second mask to have apertures at positions corresponding to dividing positions of the cap portions, on the cap layer after a removal of the first mask,
        dividing the cap layer into the cap portions by etching using the second mask, and
        removing the second mask;
    preparing a semiconductor wafer on which a plurality of sensor elements is formed;
    fixing the plurality of cap portions, which have been formed on the supporting substrate via the thermal separable agent, to the semiconductor wafer such that each one of the sensor elements is disposed within the cavity of one of the plurality of cap portions; and
    heating the thermal separable agent to the predetermined temperature to separate the thermal separable agent together with the supporting substrate from the cap portion so as to leave the cap portion on the semiconductor wafer.

6. The method of manufacturing a semiconductor sensor of claim 5, wherein the predetermined temperature is from about 150° C. to about 170° C.

7. The method of manufacturing a semiconductor sensor of claim 5, wherein the thermal separable agent comprises thermoplastic polyimide, thermoplastic polyamide-imide or thermal release tape.

8. The method of manufacturing a semiconductor sensor of claim 5, wherein the forming of a cavity in each one of the cap portions further comprises forming a plurality of supporting portions on each one of the cap portions.

* * * * *